(12) United States Patent
Kuo et al.

(10) Patent No.: US 11,143,965 B2
(45) Date of Patent: Oct. 12, 2021

(54) OPTICAL LITHOGRAPHY SYSTEM FOR PATTERNING SEMICONDUCTOR DEVICES AND METHOD OF USING THE SAME

(71) Applicant: Taiwan Semiconductor Manufacturing Company, Ltd., Hsinchu (TW)

(72) Inventors: Hung-Jui Kuo, Hsinchu (TW); Ting-Yang Yu, Hsinchu (TW); Ming-Tan Lee, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/399,332

(22) Filed: Apr. 30, 2019

(65) Prior Publication Data

US 2020/0348601 A1 Nov. 5, 2020

(51) Int. Cl.
*G03F 7/20* (2006.01)
*G02B 17/08* (2006.01)
*H01L 21/48* (2006.01)

(52) U.S. Cl.
CPC ..... *G03F 7/70266* (2013.01); *G02B 17/0892* (2013.01); *G03F 7/7015* (2013.01); *G03F 7/70225* (2013.01); *G03F 7/70283* (2013.01); *G03F 7/70308* (2013.01); *G03F 7/70641* (2013.01); *G03F 7/70958* (2013.01); *H01L 21/4871* (2013.01)

(58) Field of Classification Search
CPC ............... G02B 17/0892; G03F 7/7015; G03F 7/70225; G03F 7/70266; G03F 7/70283; G03F 7/70308; G03F 7/70641; G03F 7/70958; H01L 21/4871
USPC .............................. 355/55, 67; 359/846, 849
See application file for complete search history.

(56) References Cited

U.S. PATENT DOCUMENTS

| | | | | |
|---|---|---|---|---|
| 5,210,653 | A | * 5/1993 | Schell | G02B 26/0816 310/26 |
| 5,602,399 | A | * 2/1997 | Mizutani | G03F 9/7026 250/548 |
| 5,757,469 | A | 5/1998 | Allen | |
| 9,436,103 | B2 | 9/2016 | Zhao et al. | |
| 2003/0234970 | A1* | 12/2003 | Phillips | G02B 26/0825 359/291 |

(Continued)

OTHER PUBLICATIONS

Henderson et al ("System Performance of A Large Deformable Mirror Using Differential Ball Screw Actuators," Proc. SPIE 0179, Adaptive Optical Components II, (Jul. 11, 1979)) (Year: 1979).*

(Continued)

*Primary Examiner* — Colin W Kreutzer
(74) *Attorney, Agent, or Firm* — Slater Matsil, LLP

(57) ABSTRACT

An optical lithography system for patterning semiconductor devices and a method of using the same are disclosed. In an embodiment, an apparatus includes an optical path; a prism disposed on the optical path; a lens disposed on the optical path; and a tunable mirror disposed on the optical path, the tunable mirror including a mirror having a concave surface at a front-side thereof; a rear support attached to a backside of the mirror; and a plurality of fine-adjustment screws extending from the rear support to the backside of the mirror.

20 Claims, 15 Drawing Sheets

(56) References Cited

U.S. PATENT DOCUMENTS

| | | | | |
|---|---|---|---|---|
| 2004/0017623 A1* | 1/2004 | Watson | ............... | G02B 7/182 |
| | | | | 359/849 |
| 2006/0023179 A1* | 2/2006 | Tschischgale | ......... | G03B 13/00 |
| | | | | 355/53 |
| 2006/0232866 A1* | 10/2006 | Sai | ................. | G02B 26/0825 |
| | | | | 359/849 |
| 2007/0012871 A1* | 1/2007 | Wagner | ............... | G02B 17/08 |
| | | | | 250/216 |
| 2007/0280609 A1* | 12/2007 | Ito | .................... | G02B 7/003 |
| | | | | 385/94 |

OTHER PUBLICATIONS

Adams et al (2018). Understanding Aspheric Lenses: Key specifications and their impact on performance. Optik & Photonik, 13(4), 60-63. (Year: 2018).*

Van Den Brink, M. et al., "Step-and-Scan and Step-and-Repeat, a Technology Comparison", ASM Lithography, SPIE Symposium on Microlithography, Mar. 10-15, 1996, 22 Pages, Santa Clara.

* cited by examiner

OPTICAL LITHOGRAPHY SYSTEM FOR PATTERNING SEMICONDUCTOR DEVICES AND METHOD OF USING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
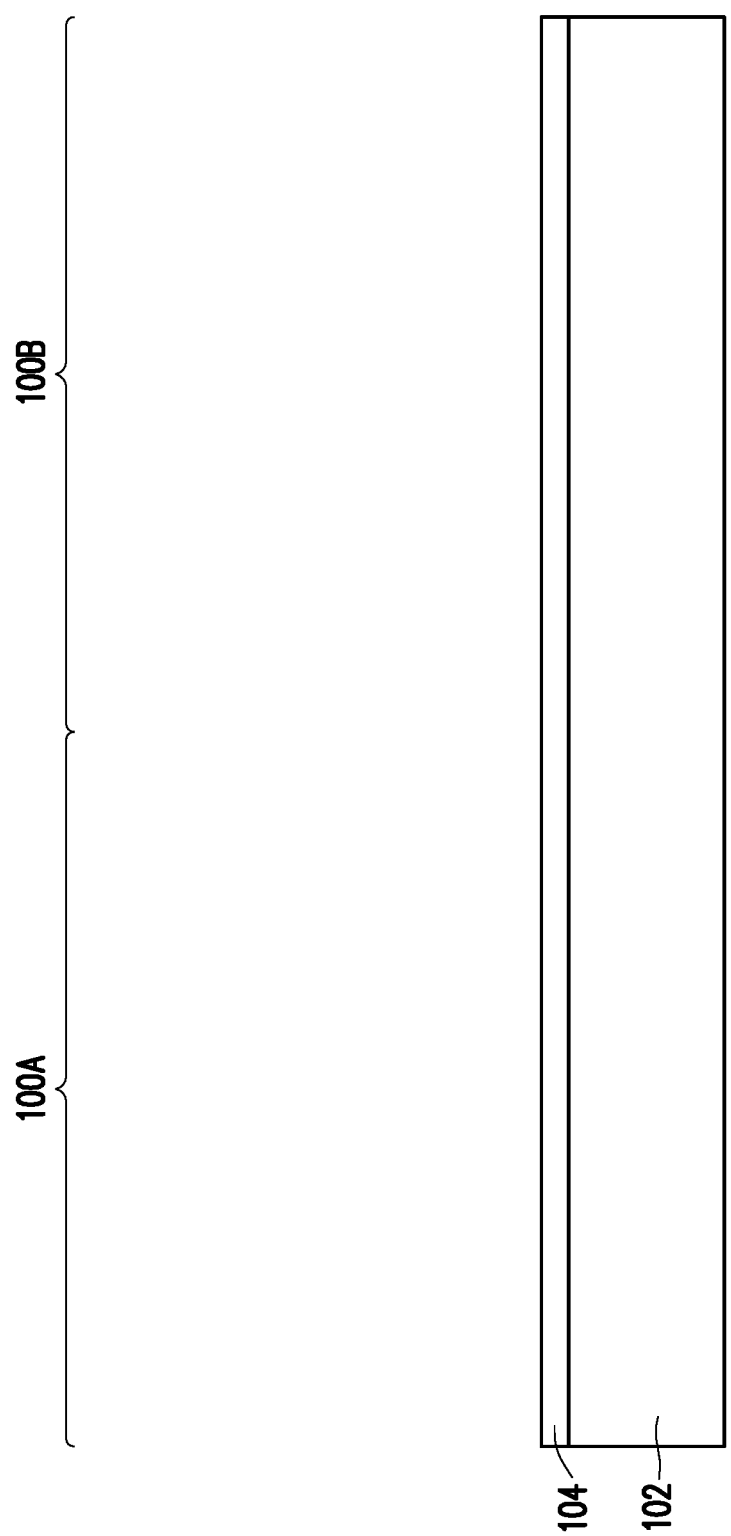
FIGS. 1 through 7 illustrate cross-sectional views of intermediate steps during a process for forming a first package structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved apparatuses for patterning semiconductor devices and semiconductor apparatuses formed using the same. In some embodiments, an optical lithography system may include a tunable concave mirror which includes fine-adjustment screws that can be used to bend the tunable concave mirror, correcting the focus of a projected image. An optical lithography system may include a beam-splitter, which lengthens the focal path and allows energy to travel through a center of a lens or near the center of the lens, rather than through edges of the lens. An optical lithography system may include an on-axis lens which does not include a concave mirror and which allows energy to travel through a center of the on-axis lens or near the center of the on-axis lens. All three of these configurations for an optical lithography system help to improve the focus of light projected by the optical lithography system, improve image quality of the projected light, and allow for finer, more accurate patterning, which improves device performance and reduces device defects.

FIGS. 1 through 7 and 12 through 15 illustrate cross-sectional views of intermediate steps during a process for forming first packages 200 (see FIG. 14), in accordance with some embodiments. A first package region 100A and a second package region 100B are illustrated, and a first package 200 is formed in each of the first package region 100A and the second package region 100B. The first packages 200 may also be referred to as integrated fan-out (InFO) packages.

In FIG. 1, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV light. The release layer 104 may be dispensed as a liquid and cured, may be a laminate film laminated onto the carrier substrate 102, or may be the like. The top surface of the release layer 104 may be leveled by a planarization process such as chemical mechanical planarization (CMP) and may have a high degree of planarity.

Figure 2:
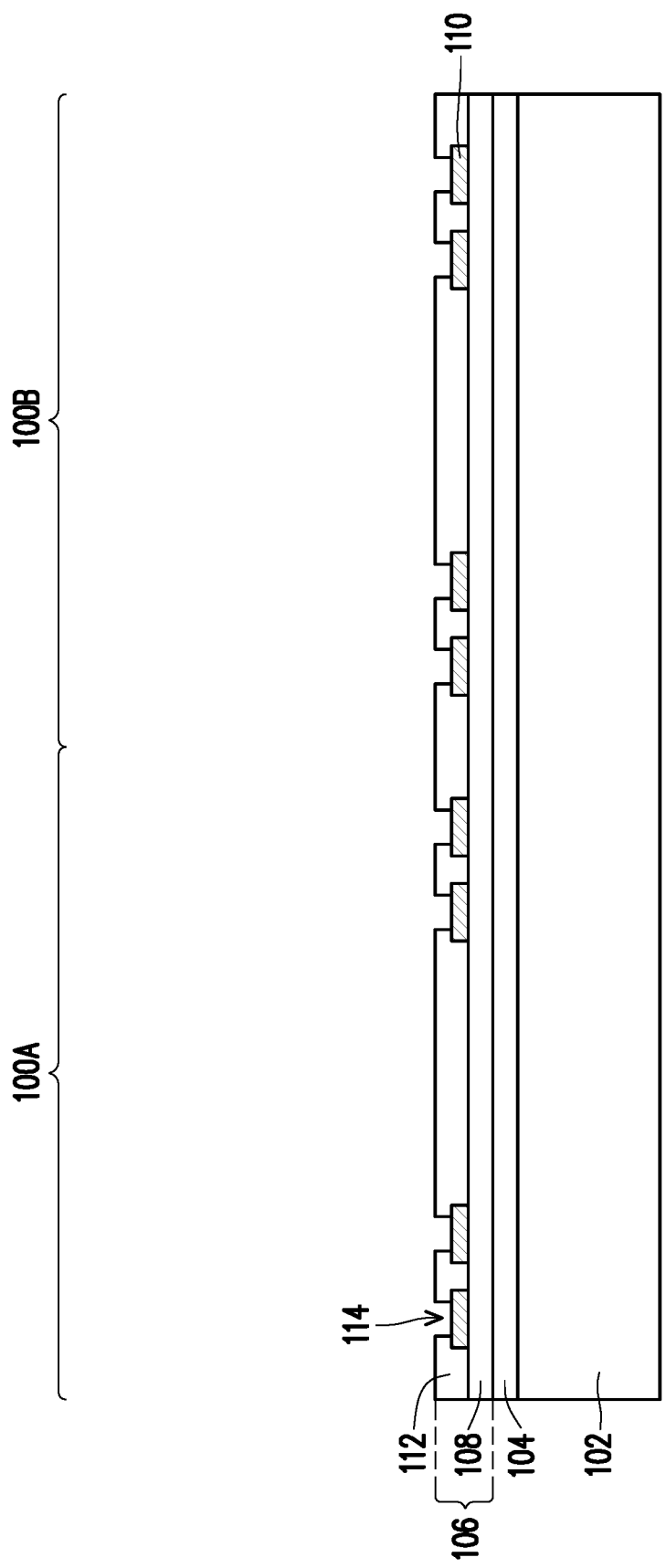

In FIG. 2, a back-side redistribution structure 106 is formed on the release layer 104. In the embodiment shown, the back-side redistribution structure 106 includes a first dielectric layer 108, a first metallization pattern 110 (sometimes referred to as redistribution layers or redistribution lines), and a second dielectric layer 112.

The first dielectric layer 108 is formed on the release layer 104. The bottom surface of the first dielectric layer 108 may be in contact with the top surface of the release layer 104. In some embodiments, the first dielectric layer 108 is formed of a polymer, such as polybenzoxazole (PBO), polyimide, benzocyclobutene (BCB), or the like. In other embodiments, the first dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The first dielectric layer 108 may be formed by any acceptable deposition process, such as spin coating, chemical vapor deposition (CVD), laminating, the like, or a combination thereof.

The first metallization pattern 110 is formed on the first dielectric layer 108. As an example of forming the first metallization pattern 110, a seed layer (not separately illustrated) is formed over the first dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not separately illustrated) is then formed and patterned on the seed layer. The photoresist may be formed by spin coating or the like, may be exposed to patterned light or another patterned energy source, and may be exposed to a developer to remove exposed or unexposed portions of the photoresist. The pattern of the photoresist corresponds to the first metallization pattern 110. The patterning forms openings through the photoresist to expose the seed layer. A conductive material (not separately illustrated) is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are then removed. The photoresist may be removed by an acceptable ashing or stripping process, such as using an oxygen plasma or the like. Once the photoresist is removed, exposed portions of the seed layer are removed using an acceptable etching process such as wet or dry etching. The remaining portions of the seed layer and the conductive material form the first metallization pattern 110.

The second dielectric layer 112 is formed on the first metallization pattern 110 and the first dielectric layer 108. In some embodiments, the second dielectric layer 112 is formed of a polymer, which may be a photo-sensitive material such as PBO, polyimide, BCB, or the like, that may be patterned using a lithography mask. In other embodiments, the second dielectric layer 112 is formed of a nitride such as silicon nitride; an oxide such as silicon oxide, PSG, BSG, BPSG; or the like. The second dielectric layer 112 may be formed by spin coating, lamination, CVD, the like, or a combination thereof. The second dielectric layer 112 is then patterned to form openings 114 exposing portions of the first metallization pattern 110. The patterning may be by an acceptable process, such as by exposing the second dielectric layer 112 to patterned light or another patterned energy source and exposing the second dielectric layer 112 to a developer when the second dielectric layer 112 is a photo-sensitive material or by etching using, for example, an anisotropic etch. In some embodiments, the second dielectric layer 112 is a material with a high coefficient of thermal expansion (CTE), such as a polyimide.

It should be appreciated that the back-side redistribution structure 106 may include any number of dielectric layers and metallization patterns. Additional dielectric layers and metallization patterns may be formed by repeating the processes for forming the first metallization pattern 110 and the second dielectric layer 112. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 3:
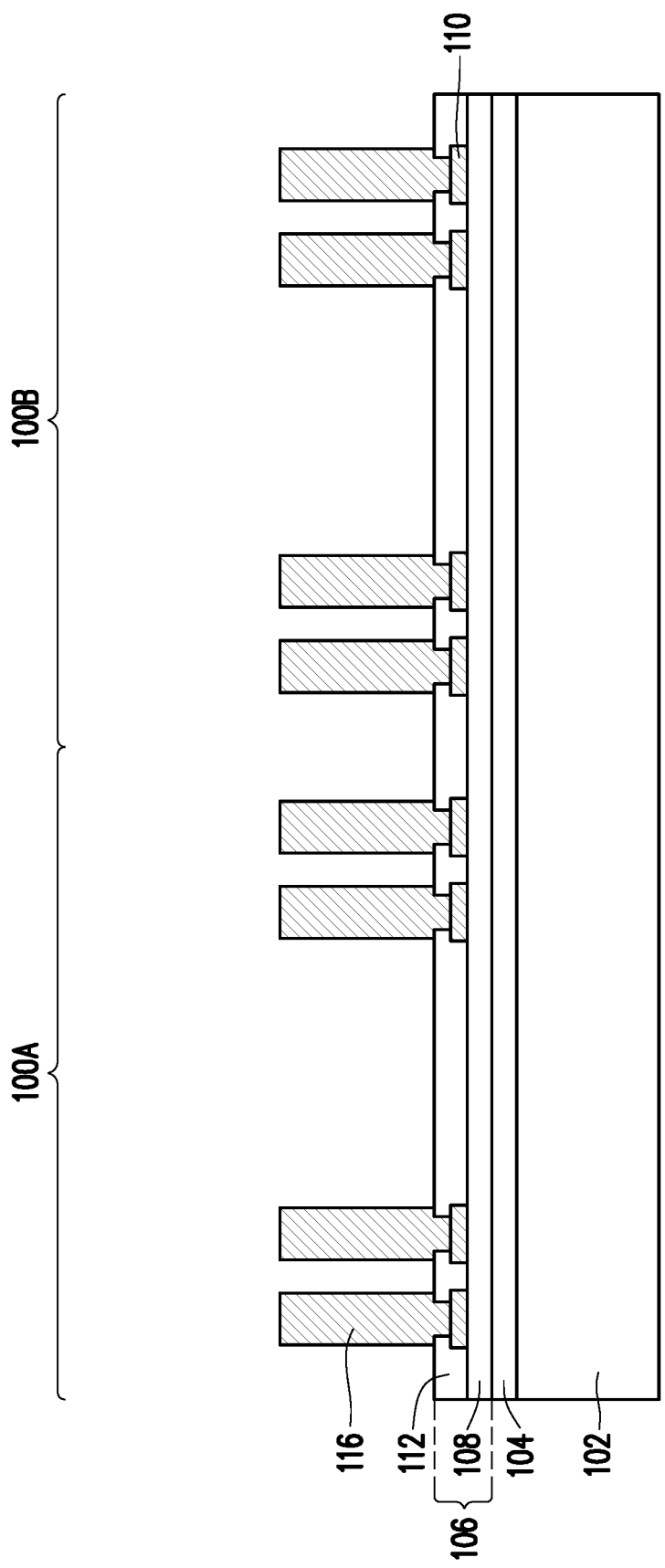

In FIG. 3, through vias 116 are formed in the openings 114, extending away from the second dielectric layer 112. In an embodiment, the through vias 116 may be formed by forming a seed layer (not separately illustrated) over the back-side redistribution structure 106, e.g., on the second dielectric layer 112 and portions of the first metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist (not separately illustrated) is formed and patterned on the seed layer. The photoresist may be formed by spin coating or the like, may be exposed to patterned light or another patterned energy source, and may be exposed to a developer to remove exposed or unexposed portions of the photoresist. The pattern of the photoresist corresponds to the through vias 116. The patterning forms openings through the photoresist to expose the seed layer. A conductive material (not separately illustrated) is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed using an acceptable etching process, such as wet or dry etching. The remaining portions of the seed layer and the conductive material form the through vias 116.

Figure 4:
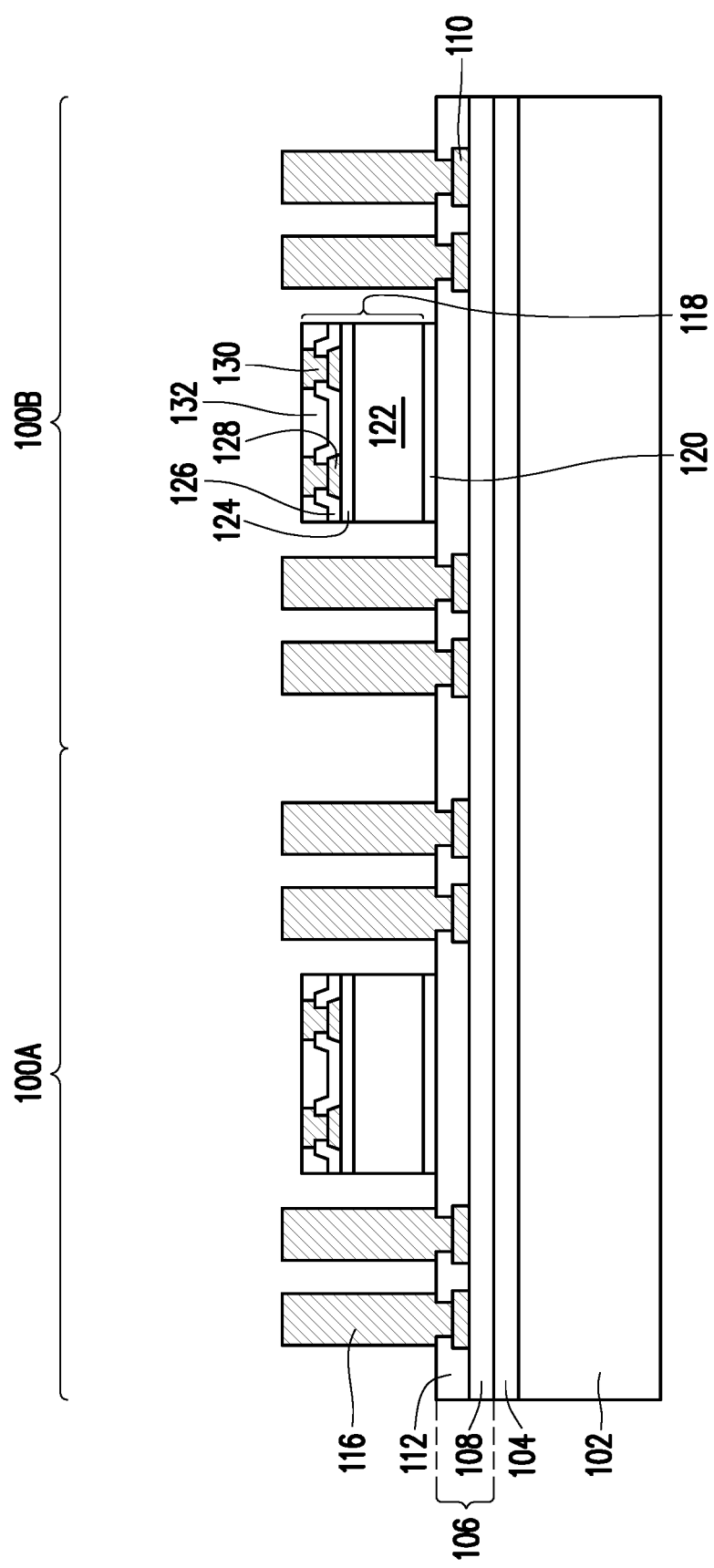

In FIG. 4, integrated circuit dies 118 are adhered to the second dielectric layer 112 by an adhesive 120. The integrated circuit dies 118 may be logic dies (e.g., central processing units, microcontrollers, or the like), memory dies (e.g., dynamic random access memory (DRAM) dies, static random access memory (SRAM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or a combination thereof. In some embodiments, the integrated circuit dies 118 may be different sizes (e.g., different heights and/or surface areas), and in other embodiments, the integrated circuit dies 118 may be the same size (e.g., same heights and/or surface areas).

Before being adhered to the second dielectric layer 112, the integrated circuit dies 118 may be processed according to applicable manufacturing processes to form integrated circuits in the integrated circuit dies 118. For example, the integrated circuit dies 118 each include a semiconductor substrate 122, such as silicon, doped or undoped, or an active layer of a semiconductor-on-insulator (SOI) substrate. The semiconductor substrate 122 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 122 and may be interconnected by interconnect structures 124 formed by, for example, metallization patterns in one or more dielectric layers on the semiconductor substrate 122 to form an integrated circuit.

The integrated circuit dies 118 further comprise pads 128, such as aluminum pads, to which external connections are made. The pads 128 are on what may be referred to as respective active sides of the integrated circuit dies 118. Passivation films 126 are on the integrated circuit dies 118 and on portions of the pads 128. Openings extend through the passivation films 126 to the pads 128. Die connectors 130, such as conductive pillars (e.g., comprising a metal such as copper), extend through the openings in the passivation films 126 and are mechanically and electrically coupled to the respective pads 128. The die connectors 130 may be formed by, for example, plating, or the like. The die connectors 130 electrically couple the respective integrated circuits of the integrated circuit dies 118.

A dielectric material 132 is on the active sides of the integrated circuit dies 118, such as on the passivation films 126 and the die connectors 130. The dielectric material 132 laterally encapsulates the die connectors 130, and the dielectric material 132 is laterally coterminous with the respective integrated circuit dies 118. The dielectric material 132 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 120 is on back-sides of the integrated circuit dies 118 and adheres the integrated circuit dies 118 to the back-side redistribution structure 106, such as the second dielectric layer 112. The adhesive 120 may be any suitable adhesive, epoxy, die attach film (DAF), or the like. The adhesive 120 may be applied to a back-side of the integrated circuit dies 118 or may be applied over the surface of the carrier substrate 102. For example, the adhesive 120 may be applied to the back-side of the integrated circuit dies 118 before the integrated circuit dies 118 are singulated into individual dies.

Although one integrated circuit die 118 is illustrated as being adhered in each of the first package region 100A and the second package region 100B, it should be appreciated that more integrated circuit dies 118 may be adhered in each of the first package region 100A and the second package region 100B. For example, multiple integrated circuit dies 118 may be adhered in the first package region 100A and the second package region 100B. Further, the integrated circuit dies 118 may vary in size. In some embodiments, the integrated circuit dies 118 may be dies with a large footprint, such as system-on-chip (SoC) devices. In embodiments where the integrated circuit dies 118 have a large footprint, the space available for the through vias 116 in the first package region 100A and the second package region 100B may be limited. Use of the back-side redistribution structure 106 allows for an improved interconnect arrangement when the package regions have limited space available for the through vias 116.

Figure 5:
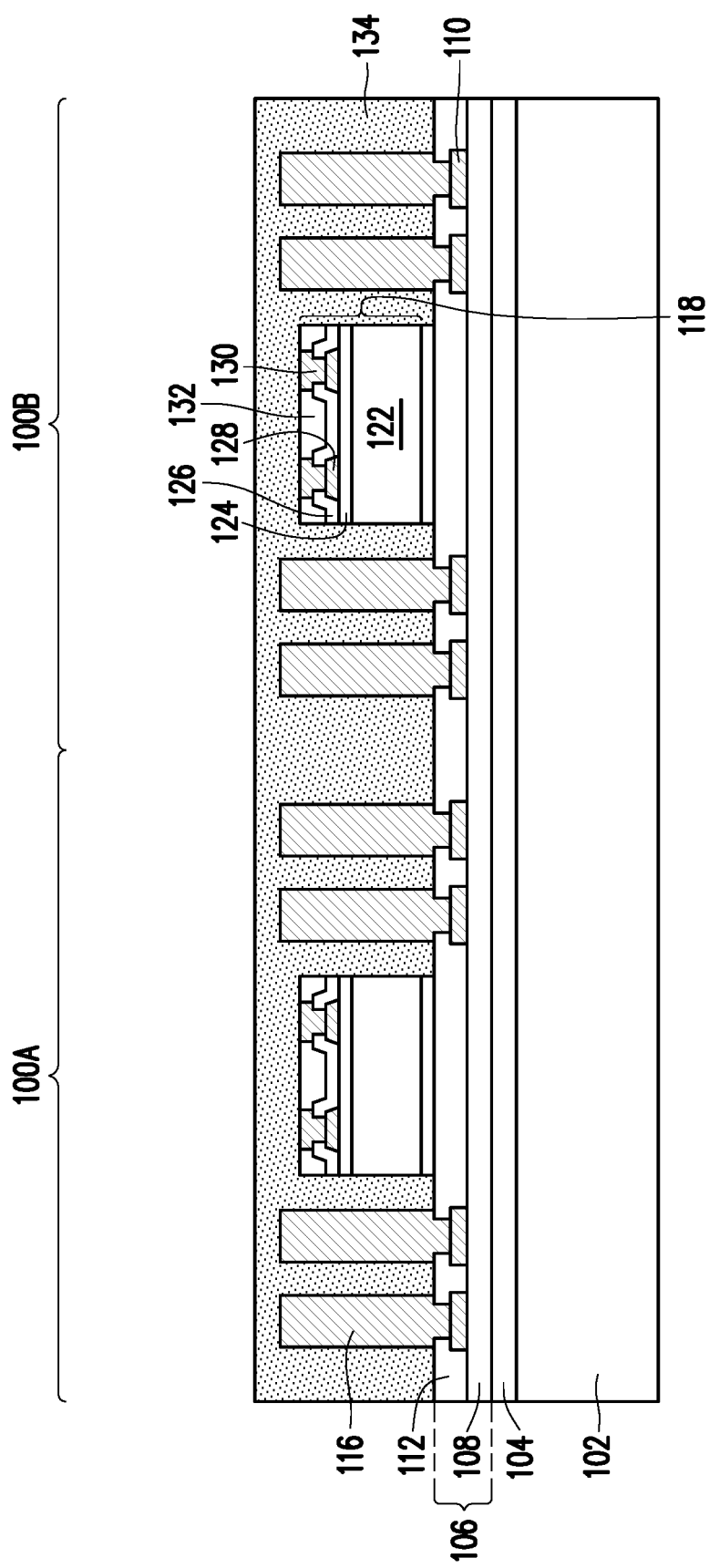

In FIG. 5, an encapsulant 134 is formed over the back-side redistribution structure 106, the integrated circuit dies 118, and the through vias 116. As illustrated in FIG. 5, after formation, the encapsulant 134 laterally encapsulates the through vias 116 and the integrated circuit dies 118. The encapsulant 134 may be a molding compound, epoxy, or the like. The encapsulant 134 may have a CTE that is similar to the CTE of the second dielectric layer 112, which may reduce CTE mismatch, reducing warpage. The encapsulant 134 may be applied by compression molding, transfer molding, or the like, and may be formed over the carrier substrate 102 such that the through vias 116 and/or the integrated circuit dies 118 are buried or covered. The encapsulant 134 is then cured.

Figure 6:
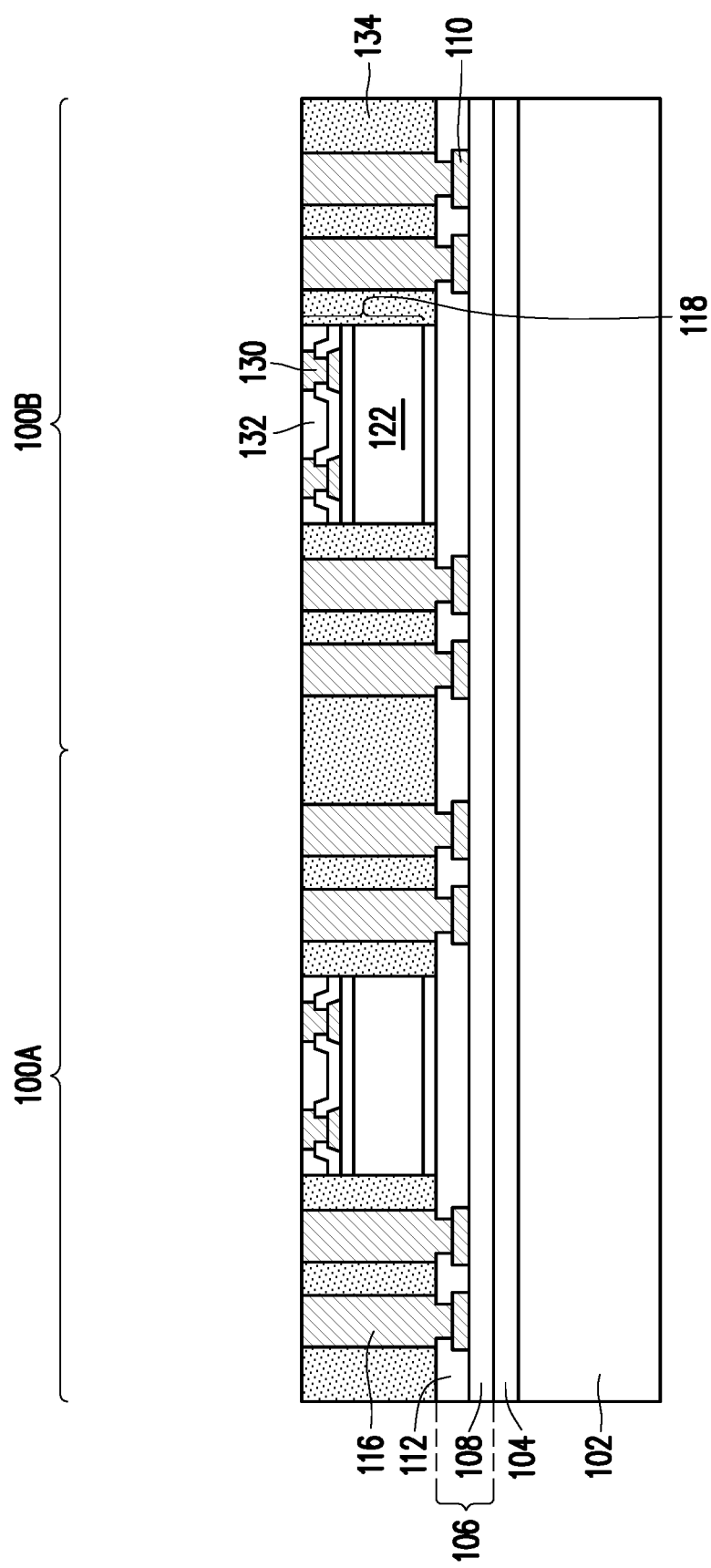

In FIG. 6, a planarization process is performed on the encapsulant 134 to expose the through vias 116 and the die connectors 130. The planarization process may also grind the dielectric material 132. Following the planarization process, top surfaces of the through vias 116, the die connectors 130, the encapsulant 134, and the dielectric material 132 may be level with one another. The planarization process may be, for example, a CMP process, a grinding process, or the like. In some embodiments, the planarization may be omitted, for example, if the through vias 116 and the die connectors 130 are already exposed.

Figure 7:
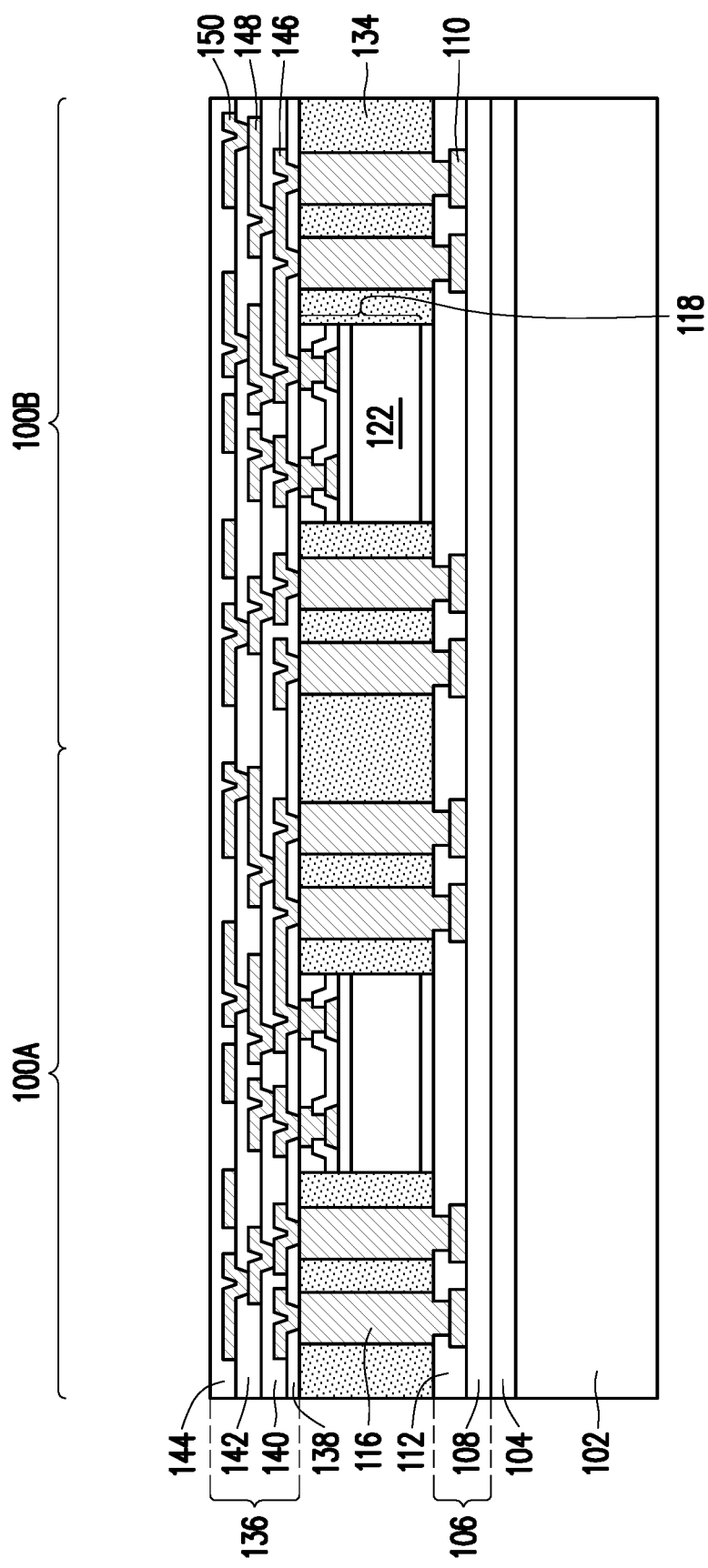

In FIG. 7, a front-side redistribution structure 136 is formed over the through vias 116, the encapsulant 134, and the integrated circuit dies 118. The front-side redistribution structure 136 includes a third dielectric layer 138, a fourth dielectric layer 140, a fifth dielectric layer 142, and a sixth dielectric layer 144; and a second metallization pattern 146, a third metallization pattern 148, and a fourth metallization pattern 150. The metallization patterns may also be referred to as redistribution layers or redistribution lines.

The front-side redistribution structure 136 is shown as an example. More or fewer dielectric layers and metallization patterns may be formed in the front-side redistribution structure 136. If fewer dielectric layers and metallization patterns are to be formed, steps and processes discussed below may be omitted. If more dielectric layers and metallization patterns are to be formed, steps and processes discussed below may be repeated.

In accordance with an embodiment, the front-side redistribution structure 136 may be formed by first depositing the third dielectric layer 138 on the encapsulant 134, the through vias 116, and the die connectors 130. In some embodiments, the third dielectric layer 138 is formed of a photo-sensitive material such as PBO, polyimide, BCB, or the like, which may be patterned using a lithography mask. The third dielectric layer 138 may be formed by spin coating, lamination, CVD, the like, or a combination thereof. The third dielectric layer 138 is then patterned. The patterning forms openings (subsequently filled by the second metallization pattern 146) exposing portions of the through vias 116 and the die connectors 130. In embodiments in which the third dielectric layer 138 is a photo-sensitive material, the third dielectric layer 138 may be patterned by exposing the third dielectric layer 138 to patterned light or another patterned energy source and exposing the third dielectric layer 138 to a developer to remove exposed or unexposed portions of the third dielectric layer 138.

The second metallization pattern 146 is then formed. The second metallization pattern 146 includes conductive lines which are formed on and extending along a major surface of the third dielectric layer 138. The second metallization pattern 146 further includes conductive vias that extend through the third dielectric layer 138 and are physically and electrically connected to the through vias 116 and the integrated circuit dies 118. The second metallization pattern 146 may be formed by forming a seed layer (not separately illustrated) over the third dielectric layer 138 and in the openings extending through the third dielectric layer 138. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist (not separately illustrated) is then formed and patterned on the seed layer. The photoresist may be formed by spin coating or the like and may be patterned by exposing the photoresist to patterned light or another patterned energy source and exposing the photoresist to a developer to remove exposed or unexposed portions of the photoresist. The pattern of the photoresist corresponds to the second metallization pattern 146. The patterning forms openings through the photoresist to expose the seed layer. A conductive material (not separately illustrated) is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the second metallization pattern 146. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The fourth dielectric layer 140 is deposited on the third dielectric layer 138 and the second metallization pattern 146. The fourth dielectric layer 140 may be formed in a manner similar to the third dielectric layer 138, and may be formed of the same material as the third dielectric layer 138.

The third metallization pattern 148 is then formed. The third metallization pattern 148 includes conductive lines on and extending along the major surface of the fourth dielectric layer 140. The third metallization pattern 148 further includes conductive vias extending through the fourth dielectric layer 140 to be physically and electrically connected to the second metallization pattern 146. The third metallization pattern 148 may be formed in a manner similar to the second metallization pattern 146, and may be formed of the same material as the second metallization pattern 146.

The fifth dielectric layer 142 is deposited on the fourth dielectric layer 140 and the third metallization pattern 148. The fifth dielectric layer 142 may be formed in a manner similar to the third dielectric layer 138, and may be formed of the same material as the third dielectric layer 138.

The fourth metallization pattern 150 is then formed. The fourth metallization pattern 150 includes conductive lines on and extending along the major surface of the fifth dielectric layer 142. The fourth metallization pattern 150 further includes conductive vias extending through the fifth dielectric layer 142 to be physically and electrically connected to the third metallization pattern 148. The fourth metallization pattern 150 may be formed in a manner similar to the second metallization pattern 146, and may be formed of the same material as the second metallization pattern 146.

The sixth dielectric layer 144 is deposited on the fifth dielectric layer 142 and the fourth metallization pattern 150. The sixth dielectric layer 144 may be formed in a manner similar to the third dielectric layer 138, and may be formed of the same material as the third dielectric layer 138.

Figure 8:
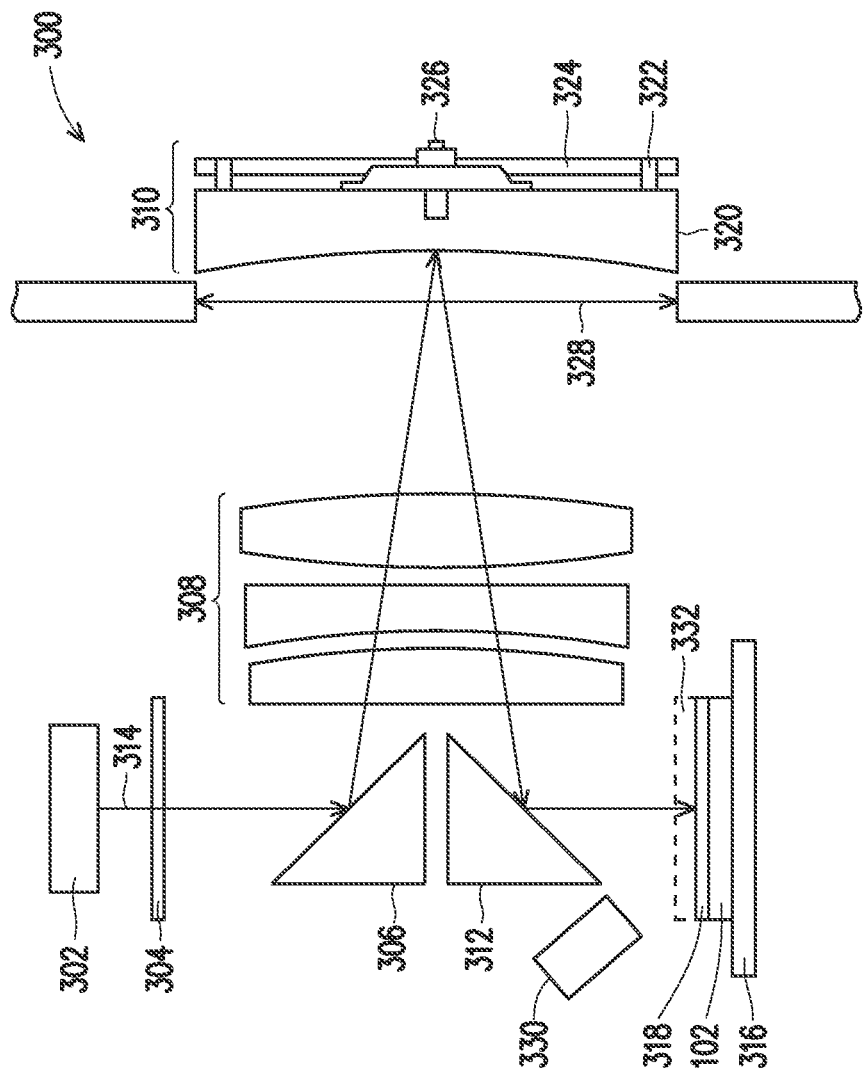
FIGS. 8 through 11 illustrate cross-sectional views of optical lithography systems used to process a first package, in accordance with some embodiments.

FIGS. 8-11 illustrate optical lithography systems used to expose the dielectric layers of the front-side redistribution structure 136 and the photoresists used to pattern the metallization patterns of the front-side redistribution structure 136 to patterned light or other patterned energy sources used for patterning the dielectric layers and the photoresists (collectively referred to as target layers 318). The optical lithography systems may be step-and-repeat systems (e.g., steppers), step-and-scan systems (e.g., scanners), or the like. FIG. 8 illustrates an optical system 300 including a tunable concave mirror 310, which may be used to correct a focus of the optical system 300. The optical system 300 further includes an energy source 302, a photomask 304 (also referred to as a reticle), an input prism 306, a lens 308, an aperture 328, an output prism 312, and a support plate 316. In various embodiments, the optical system 300 may be a Wynne-Dyson projection lens.

In an embodiment the support plate 316 is a surface to which the carrier substrate 102 including the target layers 318 may be placed on or attached to and which provides support and control to the carrier substrate 102 during exposure of the target layers 318. Additionally, the support plate 316 may include a motor and may be movable along one or more axes, as well as providing any desired heating or cooling to the carrier substrate 102 and the target layers 318 in order to prevent temperature gradients from affecting the exposure process.

The energy source 302 supplies energy 314 which travels along an optical path and may be used to pattern the target layers 318. The energy source 302 may be a source of the electromagnetic radiation, such as a mercury lamp (with a wavelength of 365 nm), a KrF excimer laser light (with a wavelength of 248 nm), an ArF excimer laser light (with a wavelength of 193 nm), an $F_2$ excimer laser light (with a wavelength of 157 nm), or the like, although any other suitable source of energy 314, such as xenon lamps, carbon arc lamps or the like, may be utilized. In an embodiment, the energy source 302 supplies energy 314 such as light to the target layers 318 in order to induce a reaction of photoactive compounds (PACs) included in the target layers 318. The chemical reaction products of the PACs' absorption of the energy 314 (e.g., acids, bases, free radicals, and the like) then react, chemically altering the target layer 318 in those portions that were illuminated. The, exposed portions or the unexposed portions of the target layer 318 may be removed by exposing the target layer to a developer solution. In an embodiment the energy 314 may be electromagnetic radiation, such as g-rays (with a wavelength of about 436 nm), i-rays (with a wavelength of about 365 nm), ultraviolet radiation, far ultraviolet radiation, x-rays, electron beams, or the like.

The photomask 304 is located between the energy source 302 and the target layers 318 in order to block portions of the energy 314 to form patterned energy prior to the energy 314 actually impinging upon the target layers 318. In an embodiment the photomask 304 may comprise a series of layers (e.g., substrate, absorbance layers, anti-reflective coating layers, shielding layers, etc.) to reflect, absorb, or otherwise block portions of the energy 314 from reaching those portions of the target layers 318 which are not desired to be illuminated. The desired pattern may be formed in the photomask 304 by forming openings through the photomask 304 in the desired shape of illumination. Additionally, in embodiments in which the optical system 300 comprises a scanner, the photomask 304 may include a motor and may be movable along one or more axes.

The lens 308 may be used to concentrate, expand, reflect, or otherwise control the energy 314 as it moves between the input prism 306 and the tunable concave mirror 310 and between the tunable concave mirror 310 and the output prism 312. The lens 308 may include one or more lenses, mirrors, filters, combinations of these, or the like to control the energy 314 along its path. In some embodiments, the lens 308 may include from 3 lenses to 5 lenses, less than 10 lenses, or the like. The lens 308 may include spherical lenses and aspherical lenses. For example, in some embodiments, the lens 308 may include up to about 5 spherical lenses and up to 5 aspherical lenses. A ratio of spherical lenses to aspherical lenses in the lens 308 may be from about 0 to about 3, such as about 2. Additionally, while the lens 308 is illustrated in FIG. 8 as being between the tunable concave mirror 310 and the input prism 306 and the output prism 312, elements of the lens 308 (e.g., individual lenses, mirrors, filters, or the like) may also be located at any location between the energy source 302 and the target layers 318.

The input prism 306 and the output prism 312 may be used to redirect the energy 314 as it moves between the photomask 304 and the lens 308 and between the lens 308 and the target layers 318. The input prism 306 may reflect the energy 314 exiting the photomask 304 such that the energy 314 passes through the upper half of the lens 308 before being reflected by the tunable concave mirror 310. The energy 314 may then be reflected by the tunable concave mirror 310 such that the energy 314 passes through the lower half of the lens 308 before being reflected by the output prism 312 to the target layers 318. The aperture 328 may be optional and may be included to provide further control over the brightness of the energy 314. The aperture 328 may have a diameter from about 100 mm to about 200 mm, such as about 150 mm.

Figure 9:
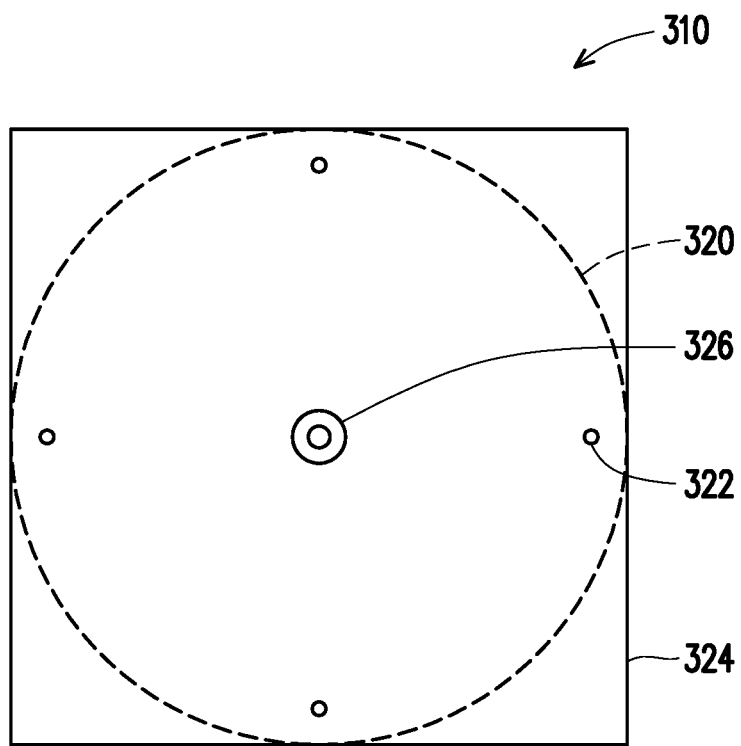

As illustrated in FIGS. 8 and 9, the tunable concave mirror 310 includes a concave mirror 320, fine adjustment screws 322, a rear support 324, and a central support 326. The concave mirror 320 is attached to the rear support 324 using the central support 326. The fine adjustment screws 322 are screwed through the rear support 324 and contact a rear surface of the concave mirror 320 facing away from the lens 308. FIG. 9 illustrates an embodiment in which the rear support 324 has a square shape, the concave mirror 320 has a circular shape, a fine adjustment screw 322 is included on each side of the rear support 324, and the central support 326 is disposed in the middle of the rear support 324. However, the rear support 324 may have any suitable shape (e.g., a rectangular shape, a circular shape, or the like), the concave mirror may have any suitable shape (e.g., an oval shape or the like), and any number of fine adjustment screws 322 may be included. The rear support 324 may be formed of a material having a higher elastic modulus than a material of the concave mirror 320, such as steel, a metal alloy, a ceramic material, or the like. The concave mirror 320 may be formed of a material such as plastic, glass, metal, or the like. A front surface of the concave mirror 320 may be coated with a highly reflective material, such as aluminum or the like.

In various embodiments, the concave mirror 320 may have a diameter from about 100 mm to about 300 mm, such as about 150 mm or about 200 mm. The rear support 324 may be square-shaped and have lengths from about 100 mm to about 300 mm, such as about 150 mm or about 200 mm.

A ratio of the diameter of the concave mirror 320 to a length of the rear support 324 may be between about 1 and about 0.5, such as about 0.8.

Irregularities in the various components of the optical system 300 may cause the energy 314 incident the surface of the target layers 318 to be defocused. For example, lens aberrations present in the lens 308 may cause the energy to be defocused along an x-axis and a y-axis. The fine adjustment screws 322 may be included to tune the curvature of the concave mirror 320, focusing the energy 314 along the x- and y-axes and correcting any lens aberration. Specifically, the fine adjustment screws 322 may be screwed inward or outward in order to bend the concave mirror 320, thereby adjusting the curvature of the concave mirror 320 and focusing the energy 314. Specific fine adjustment screws 322 may be included for correcting lens aberrations along the x-axis and other fine adjustment screws 322 may be included for correcting lens aberrations along the y-axis.

The optical system 300 may further include a detector 330 for detecting the focus of the optical system 300 (e.g., a focus of the optical system 300 along an x-axis and along a y-axis) and for correcting any lens aberration present in the lenses of the optical system 300. In some embodiments, the detector 330 may be used to autofocus the optical system 300 and may include a sensor, a control system, and motors connected to the fine adjustment screws 322. The focus of the optical system 300 may be calibrated based on a distance between the detector 330 and the target layers 318. As such, in some embodiments, the detector 330 may detect a distance between the detector 330 and the target layers 318. The detector 330 may analyze an image of the energy 314 incident on the target layers 318 after the energy 314 has been passed through the photomask 304 and the remainder of the optical system 300. The detector 330 may then use the motors to turn the fine adjustment screws 322 in order to adjust the focus of the optical system 300, based on the detection by the detector 330. In some embodiments, the detector 330 may be used to manually adjust the focus of the optical system 300 and may include a focus indicator which indicates the focus determined by the detector 300. The fine adjustment screws 322 may be manually adjusted until the focus indicator indicates that the optical system 300 is sufficiently focused. The focus of the optical system 300 may be detected by the detector 330 and corrected by adjusting the tunable concave mirror 310 upon setup of the optical system 300, between different runs of wafers, after each wafer is patterned by the optical system 300, or the like. In embodiments in which the focus of the optical system 300 is corrected while a carrier substrate 102 is disposed on the support platform 316, a shutter 332 (not separately illustrated) may be placed over the target layers 318 to protect the target layers 318 from being exposed to the energy 314 which has not been correctly focused. The focus of the optical system 300 may be corrected such that a focus difference between an x-axis and a y-axis for the energy 314 is less than about 5 μm. In addition, including the tunable concave mirror 310 allows lens aberrations of the optical system 300 to be controlled within 5%.

such a focus difference between an x-axis and a y-axis of the energy 314 incident on the target layers 318 is less than about 5 μm, or lens aberrations in the energy 314 are less than 5 percent.

Including the detector 330 and the tunable concave mirror 310 in the optical system 300 to detect and correct the focus of the optical system 300 allows for finer patterns to be patterned in the target layers 318 with greater accuracy. This improves device performance and reduces defects in devices formed using the optical system 300 including the tunable concave mirror 310.

Figure 10:
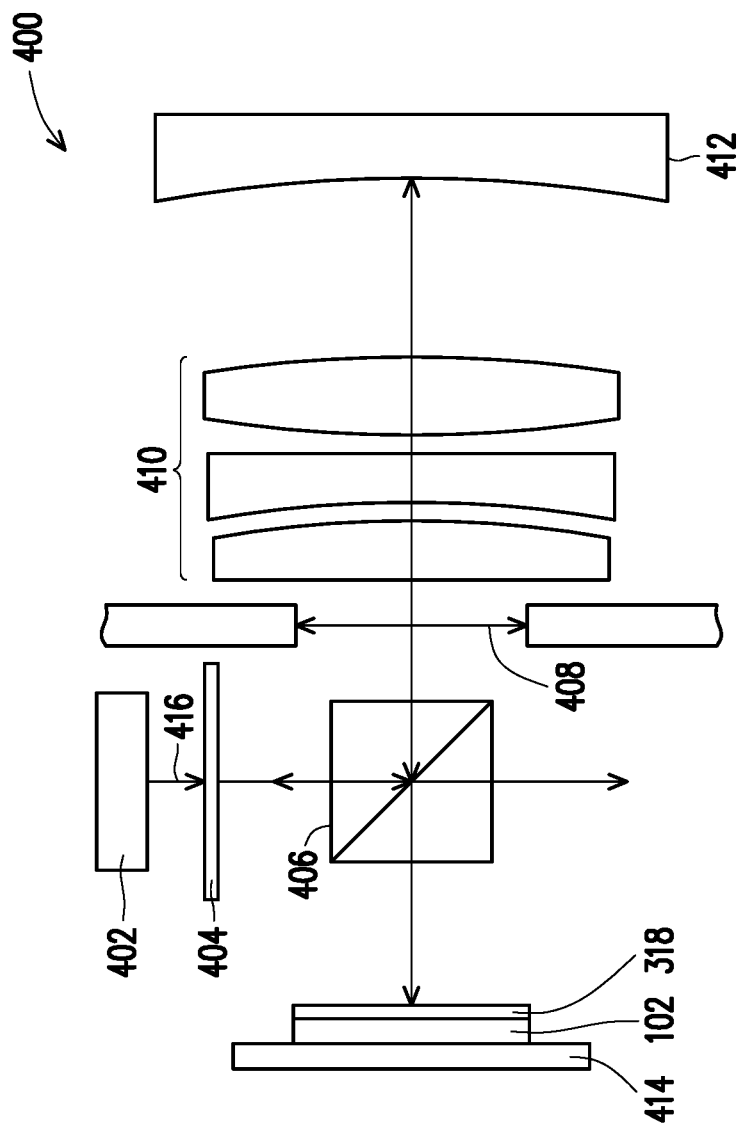

FIG. 10 illustrates an optical system 400 including a beam splitter 406, which may be used to correct the focus of the optical system 400. The optical system 400 further includes an energy source 402, a photomask 404, an aperture 408, a lens 410, a concave mirror 412, and a support plate 414.

In an embodiment the support plate 414 is a surface to which the carrier substrate 102 including the target layers 318 may be placed on or attached to and which provides support and control to the carrier substrate 102 during exposure of the target layers 318. Additionally, the support plate 414 may include a motor and may be movable along one or more axes, as well as providing any desired heating or cooling to the carrier substrate 102 and the target layers 318 in order to prevent temperature gradients from affecting the exposure process.

The energy source 402 supplies energy 416 which travels along an optical path and may be used to pattern the target layers 318. The energy source 402 may be a source of the electromagnetic radiation, such as a mercury lamp (with a wavelength of 365 nm), a KrF excimer laser light (with a wavelength of 248 nm), an ArF excimer laser light (with a wavelength of 193 nm), an $F_2$ excimer laser light (with a wavelength of 157 nm), or the like, although any other suitable source of energy 416, such as xenon lamps, carbon arc lamps or the like, may be utilized. In an embodiment, the energy source 402 supplies energy 416 such as light to the target layers 318 in order to induce a reaction of photoactive compounds (PACs) included in the target layers 318. The chemical reaction products of the PACs' absorption of the energy 416 (e.g., acids, bases, free radicals, and the like) then react, chemically altering the target layer 318 in those portions that were illuminated. The, exposed portions or the unexposed portions of the target layer 318 may be removed by exposing the target layer to a developer solution. In an embodiment the energy 416 may be electromagnetic radiation, such as g-rays (with a wavelength of about 436 nm), i-rays (with a wavelength of about 365 nm), ultraviolet radiation, far ultraviolet radiation, x-rays, electron beams, or the like.

The photomask 404 is located between the energy source 402 and the target layers 318 in order to block portions of the energy 416 to form patterned energy prior to the energy 416 actually impinging upon the target layers 318. In an embodiment the photomask 404 may comprise a series of layers (e.g., substrate, absorbance layers, anti-reflective coating layers, shielding layers, etc.) to reflect, absorb, or otherwise block portions of the energy 416 from reaching those portions of the target layers 318 which are not desired to be illuminated. The desired pattern may be formed in the photomask 404 by forming openings through the photomask 404 in the desired shape of illumination. Additionally, in embodiments in which the optical system 400 comprises a scanner, the photomask 404 may include a motor and may be movable along one or more axes. The aperture 408 may be optional and may be included to provide further control over the brightness of the energy 416.

The lens 410 may be used to concentrate, expand, reflect, or otherwise control the energy 416 as it moves between the beam splitter 406 and the concave mirror 412. The lens 410 may include one or more lenses, mirrors, filters, combinations of these, or the like to control the energy 416 along its path. In some embodiments, the lens 410 may include from 3 lenses to 5 lenses, less than 10 lenses, or the like. The lens 410 may include spherical lenses and aspherical lenses. For example, in some embodiments, the lens 410 may include from 1 to 10 spherical lenses and up to 10 aspherical lenses. A ratio of aspherical lenses to spherical lenses in the lens 410 may be from 0 to 5, such as 2. Additionally, while the lens 410 is illustrated in FIG. 10 as being between the beam splitter 406 and the concave mirror 412, elements of the lens 410 (e.g., individual lenses, mirrors, filters, or the like) may also be located at any location between the energy source 402 and the target layers 318.

The beam splitter 406 may split the energy 416 such that a first portion of the energy 416 passes through the beam splitter 406 and a second portion of the energy 416 is reflected by the beam splitter 406. The beam splitter 406 may split the energy 416 after the energy 416 passes through the photomask 404 and again after the energy 416 has been reflected by the concave mirror 412 and passes through the lens 410. The reflected energy 416 may pass through a center of the lens 410 or close to the center of the lens 410, such as within about 50 mm or about 150 mm of the center of the lens 410, after being reflected by the beam splitter 406 and after being reflected by the concave mirror 412. Passing the energy 416 through the center of the lens 410, rather than upper and lower portions of the lens 308, as in the embodiment illustrated in FIGS. 8 and 9, improves the quality of the energy 416 impinging the target layers 318. Moreover, reflecting the energy 416 using the beam splitter 406 increases the focal length of the optical system 400 such that a focus difference between an x-axis and a y-axis for the energy 416 is less than about 5 μm. In addition, including the beam splitter 406 allows lens aberrations of the optical system 400 to be controlled within 5%. However, the beam splitter 406 may serve to reduce the quantity of the energy 416 impinging the target layers 318 by about 75% or more.

The concave mirror 412 may be used to reflect the energy 416 which passes through the lens 410 back through the lens 410. In various embodiments, the concave mirror 412 may be the same as or similar to the tunable concave mirror 310 and may be used to tune the focus of the energy 416. As such, the quality of the energy 416 impinging the target layers 318 may be further improved, which improvements reduce defects and improve device performance in devices formed using the optical system 400.

Figure 11:
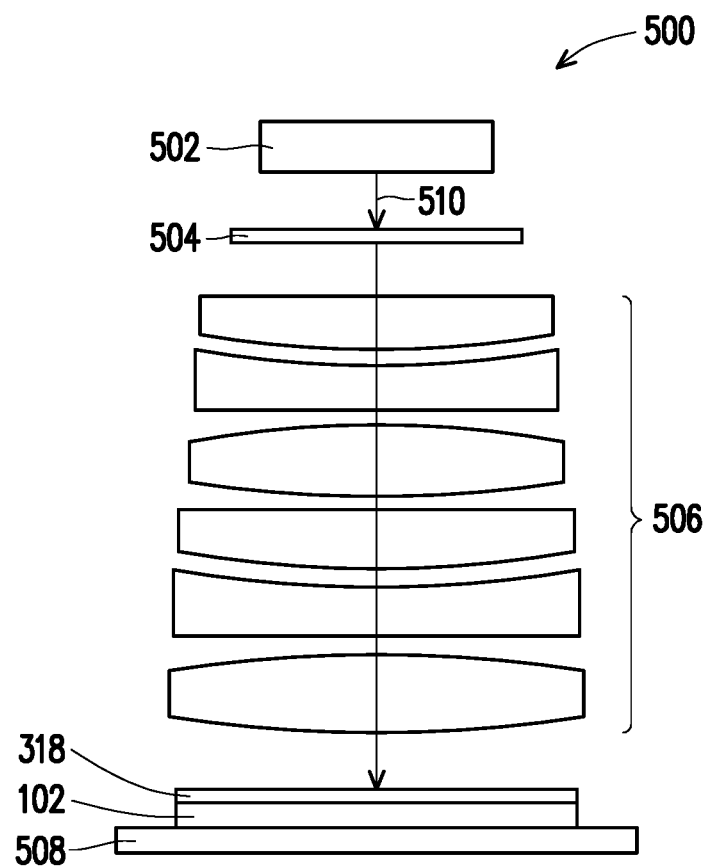

FIG. 11 illustrates an optical system 500 including an on-axis lens 506, which may be used to improve the quality of a projected image. The optical system 500 further includes an energy source 502, a photomask 504, and a support plate 508.

In an embodiment the support plate 508 is a surface to which the carrier substrate 102 including the target layers 318 may be placed on or attached to and which provides support and control to the carrier substrate 102 during exposure of the target layers 318. Additionally, the support plate 508 may include a motor and may be movable along one or more axes, as well as providing any desired heating or cooling to the carrier substrate 102 and the target layers 318 in order to prevent temperature gradients from affecting the exposure process.

The energy source 502 supplies energy 510 which travels along an optical path and may be used to pattern the target layers 318. The energy source 502 may be a source of the electromagnetic radiation, such as a mercury lamp (with a wavelength of 365 nm), a KrF excimer laser light (with a wavelength of 248 nm), an ArF excimer laser light (with a wavelength of 193 nm), an $F_2$ excimer laser light (with a wavelength of 157 nm), or the like, although any other suitable source of energy 510, such as xenon lamps, carbon arc lamps or the like, may be utilized. In an embodiment, the energy source 502 supplies energy 510 such as light to the target layers 318 in order to induce a reaction of photoactive compounds (PACs) included in the target layers 318. The chemical reaction products of the PACs' absorption of the energy 510 (e.g., acids, bases, free radicals, and the like) then react, chemically altering the target layer 318 in those portions that were illuminated. The, exposed portions or the unexposed portions of the target layer 318 may be removed by exposing the target layer to a developer solution. In an embodiment the energy 510 may be electromagnetic radiation, such as g-rays (with a wavelength of about 436 nm), i-rays (with a wavelength of about 365 nm), ultraviolet radiation, far ultraviolet radiation, x-rays, electron beams, or the like.

The photomask 504 is located between the energy source 502 and the target layers 318 in order to block portions of the energy 510 to form patterned energy prior to the energy 510 actually impinging upon the target layers 318. In an embodiment the photomask 504 may comprise a series of layers (e.g., substrate, absorbance layers, anti-reflective coating layers, shielding layers, etc.) to reflect, absorb, or otherwise block portions of the energy 510 from reaching those portions of the target layers 318 which are not desired to be illuminated. The desired pattern may be formed in the photomask 504 by forming openings through the photomask 504 in the desired shape of illumination. Additionally, in embodiments in which the optical system 500 comprises a scanner, the photomask 504 may include a motor and may be movable along one or more axes.

The on-axis lens 506 may be used to concentrate, expand, reflect, or otherwise control the energy 510 as it moves between the photomask 504 and the target layers 318. The on-axis lens 506 may include one or more lenses, mirrors, filters, combinations of these, or the like to control the energy 510 along its path. In some embodiments, the on-axis lens 506 may include from 10 lenses to 25 lenses, less than 30 lenses, or the like. The on-axis lens 506 may include spherical lenses and aspherical lenses. For example, in some embodiments, the on-axis lens 506 may include from 5 to 20 spherical lenses and up to 10 aspherical lenses. A ratio of spherical lenses to aspherical lenses in the on-axis lens 506 may be from about 0 to about 5, such as about 1. Additionally, while the on-axis lens 506 is illustrated in FIG. 11 as being between the photomask 504 and the target layers 318, elements of the on-axis lens 506 (e.g., individual lenses, mirrors, filters, or the like) may also be located at any location between the energy source 502 and the target layers 318.

As illustrated in FIG. 11, the energy 510 may pass through the center of the on-axis lens 506 or near the center of the on-axis lens 506, such as within about 50 mm or about 150 mm of the center of the lens 510. Passing the energy 510 through the center of the on-axis lens 506, rather than upper and lower portions of the lens 308, as in the embodiment illustrated in FIGS. 8 and 9, improves the quality of the energy 510 impinging the target layers 318. Including the on-axis lens 506 in the optical system 500 may improve the quality of the energy 510 impinging the target layers 318 such that a focus difference between an x-axis and a y-axis for the energy 510 is less than about 5 μm. In addition, including the on-axis lens 506 allows lens aberrations of the optical system 500 to be controlled within 5%. Moreover, including a greater number of lenses and a greater number of aspherical lenses in particular in the on-axis lens 506 may further improve the quality of the energy 510 impinging the target layers 318. Such improvements in the quality of the energy 510 reduce defects and improve device performance in devices formed using the optical system 500.

Figure 12:
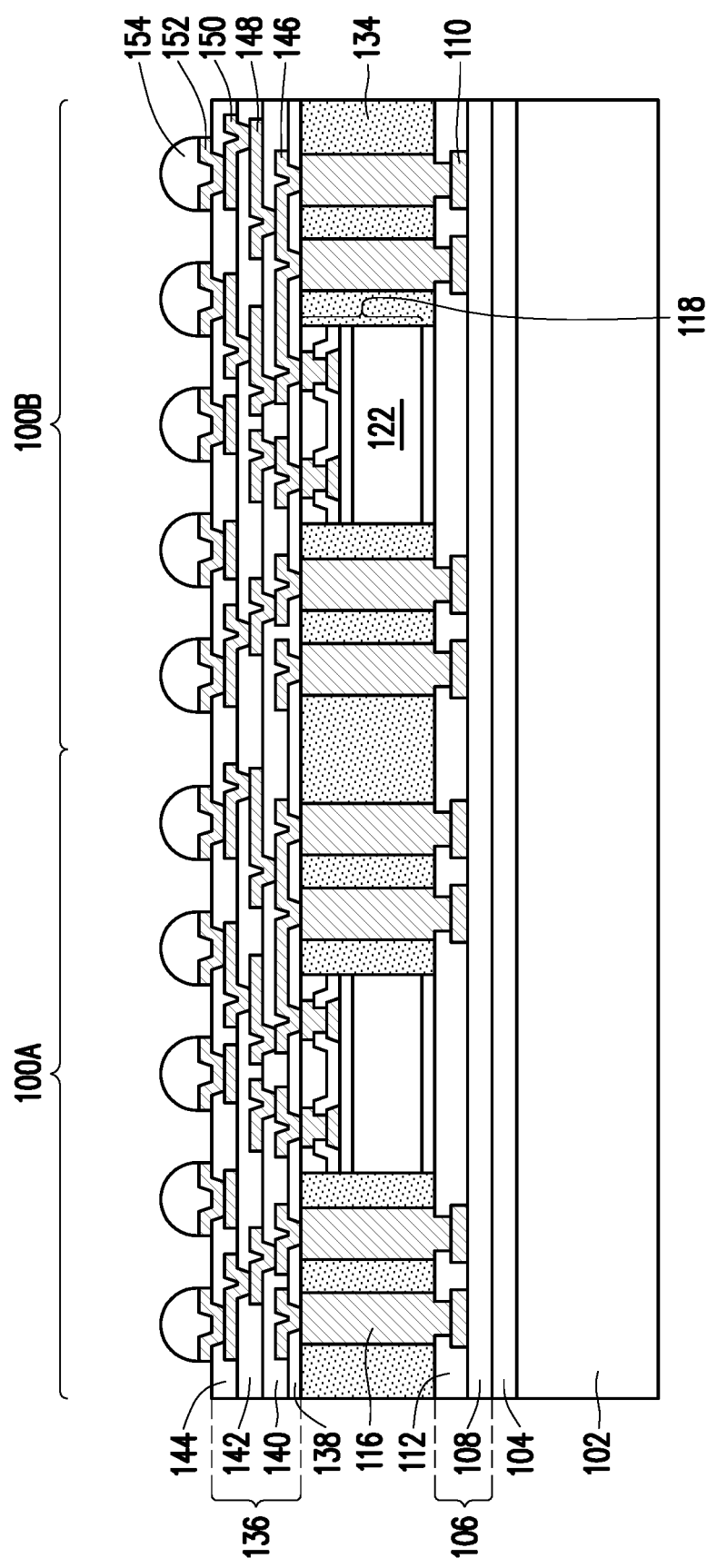
FIGS. 12 through 15 illustrate cross-sectional views of intermediate steps during a process for further forming a first package and for attaching other package structures to the first package, in accordance with some embodiments.

In FIG. 12, UBMs 152 are formed on and extending through the sixth dielectric layer 144 and conductive connectors 154 are formed on the UBMs 152. As an example to form the UBMs 152, the sixth dielectric layer 144 may be patterned to form openings (not separately illustrated) exposing portions of the fourth metallization pattern 150. The patterning may be by an acceptable process, such as by exposing the sixth dielectric layer 144 to light when the sixth dielectric layer 144 is a photo-sensitive material or by etching using, for example, an anisotropic etch. If the sixth dielectric layer 144 is a photo-sensitive material, the sixth dielectric layer 144 can be developed after the exposure. The openings for the UBMs 152 may be wider than the openings for the conductive via portions of the second metallization pattern 146, the third metallization pattern 148, and the fourth metallization pattern 150. A seed layer (not separately illustrated) is formed over the sixth dielectric layer 144 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 152. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the UBMs 152. In embodiments where the UBMs 152 are formed differently, more photoresist and patterning steps may be utilized.

Conductive connectors 154 are then formed over the UBMs 152. The conductive connectors 154 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 154 may include a conductive material such as solder, copper, aluminum, gold, nickel, silver, palladium, tin, the like, or a combination thereof. In some embodiments, the conductive connectors 154 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 154 comprise metal pillars (such as a copper pillar) formed by a sputtering, printing, electro plating, electroless plating, CVD, or the like. The metal pillars may be solder free and have substantially vertical sidewalls. In some embodiments, a metal cap layer (not separately illustrated) is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 13:
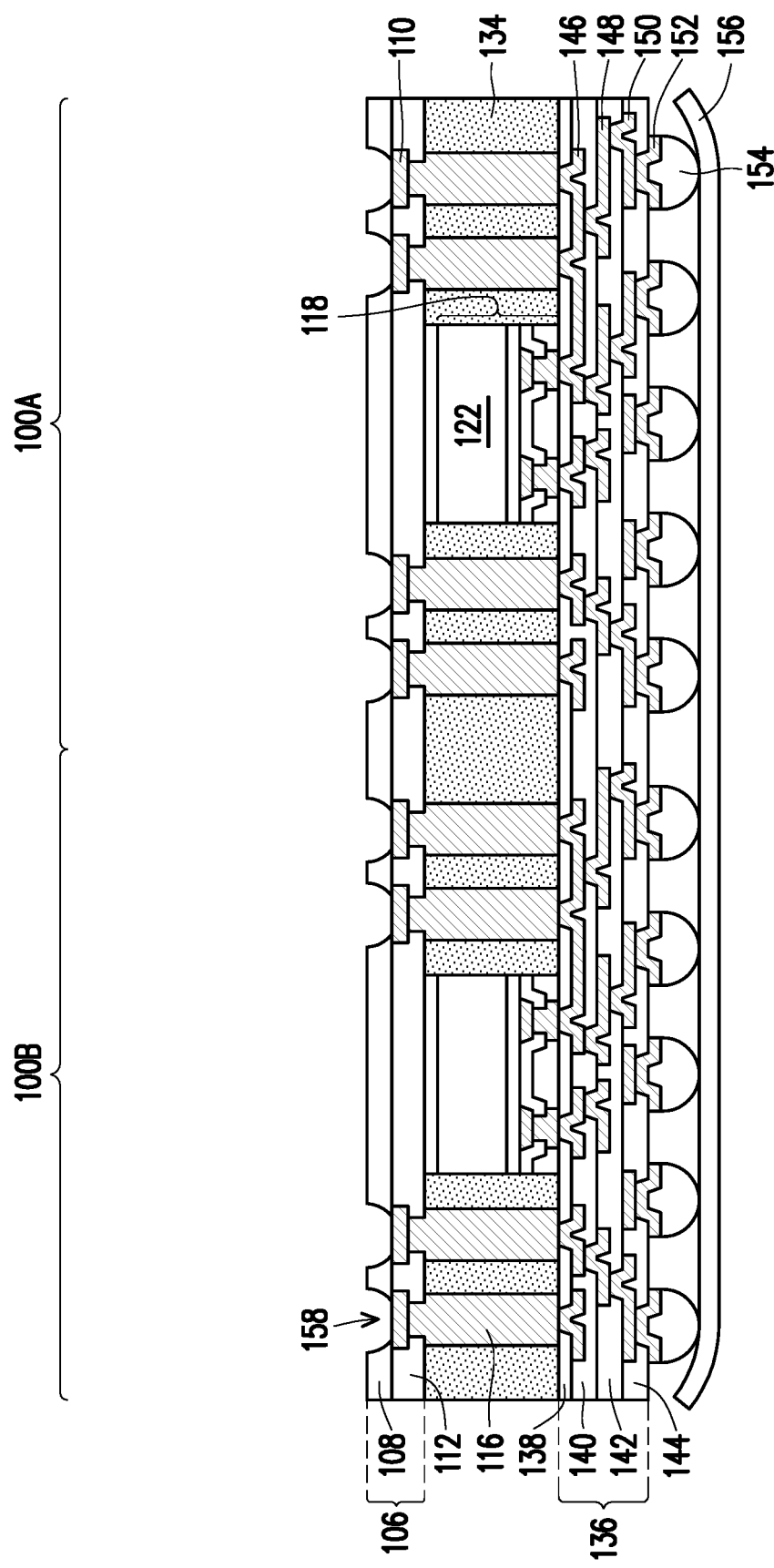

In FIG. 13, a carrier substrate de-bonding is performed to detach (de-bond) the carrier substrate 102 from the backside redistribution structure 106, e.g., the first dielectric layer 108. Features remaining after the de-bonding (e.g., in the first package region 100A and the second package region 100B) form the first packages 200. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape 156. Further, openings 158 are formed through the first dielectric layer 108 to expose portions of the first metallization pattern 110. The openings 158 may be formed, for example, using laser drilling, etching, or the like.

Figure 14:
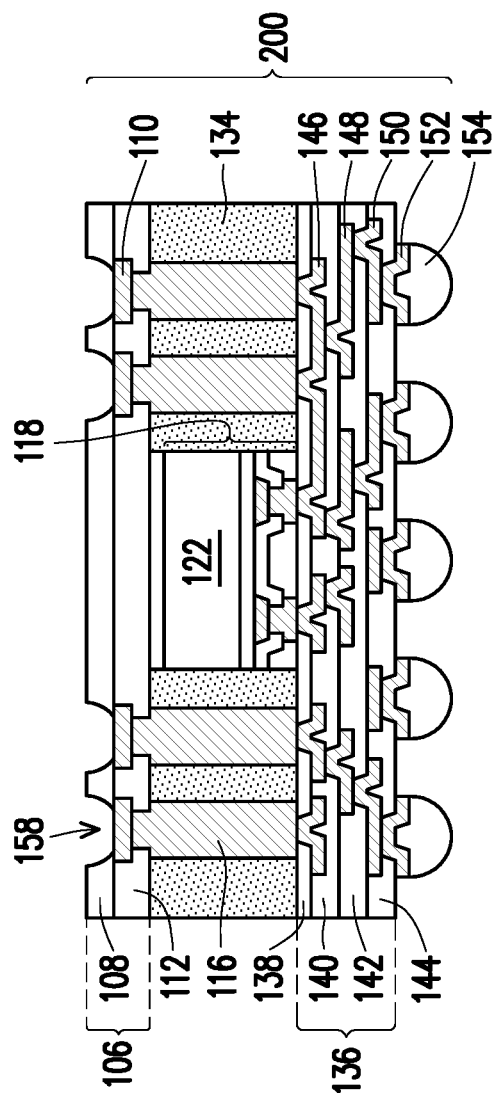

In FIG. 14, a singulation process is performed by sawing along scribe line regions 160 illustrated in FIG. 13, e.g., between the adjacent first package region 100A and the second package region 100B, resulting in a singulated first package 200. The sawing singulates the first package region 100A from the second package region 100B. The singulation results in the first package 200, which may be from one of the first package region 100A or the second package region 100B, being singulated. The first package 200 may also be referred to as an integrated fan-out (InFO) package 200 or a first package 200.

Figure 15:
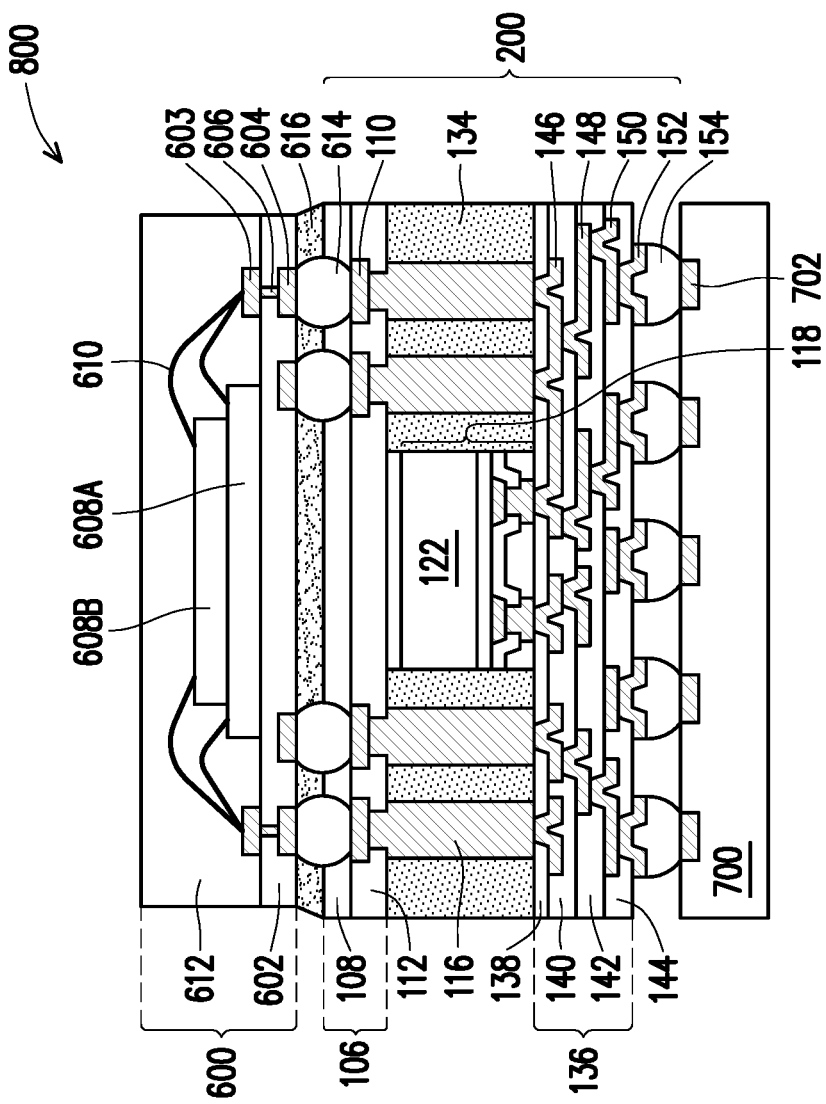

FIG. 15 illustrates a semiconductor package 800 including the first package 200, a second package 600, and a package substrate 700. The second package 600 includes a substrate 602 and one or more stacked dies 608 (e.g., a first die 608A and a second die 608B) coupled to the substrate 602. The substrate 602 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 602 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 602 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films may be used for substrate 602.

The substrate 602 may include active and passive devices (not separately illustrated). As one of ordinary skill in the art will recognize, a wide variety of devices such as transistors, capacitors, resistors, combinations of these, and the like may be used to generate the structural and functional requirements of the design for the second package 600. The devices may be formed using any suitable methods.

The substrate 602 may also include metallization layers (not separately illustrated) and through vias 606. The metallization layers may be formed over the active and passive devices and are designed to connect the various devices to form functional circuitry. The metallization layers may be formed of alternating layers of dielectric (e.g., layers of low-k dielectric material) and conductive material (e.g., copper) with vias interconnecting the layers of conductive material and may be formed through any suitable process (such as deposition, damascene, dual damascene, or the like). In some embodiments, the substrate 602 is substantially free of active and passive devices.

The substrate 602 may have first bond pads 603 on a first side the substrate 602 to couple to the stacked dies 608, and second bond pads 604 on a second side of the substrate 602, the second side being opposite the first side of the substrate 602, to couple to the conductive connectors 614. In some embodiments, the first bond pads 603 and the second bond pads 604 are formed by forming recesses (not separately illustrated) into dielectric layers (not separately illustrated) on the first and second sides of the substrate 602. The recesses may be formed to allow the first bond pads 603 and the second bond pads 604 to be embedded into the dielectric layers. In other embodiments, the recesses are omitted as the first bond pads 603 and the second bond pads 604 may be formed on the dielectric layer. In some embodiments, the first bond pads 603 and the second bond pads 604 include a thin seed layer (not separately illustrated) made of copper, titanium, nickel, gold, palladium, the like, or a combination thereof. The conductive material of the first bond pads 603 and the second bond pads 604 may be deposited over the thin seed layer. The conductive material may be formed by an electro-chemical plating process, an electroless plating process, CVD, ALD, PVD, the like, or a combination thereof. In an embodiment, the conductive material of the first bond pads 603 and the second bond pads 604 is copper, tungsten, aluminum, silver, gold, the like, or a combination thereof.

In an embodiment, the first bond pads 603 and the second bond pads 604 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first bond pads 603 and the second bond pads 604. Any suitable materials or layers of material that may be used for the first bond pads 603 and the second bond pads 604 are fully intended to be included within the scope of the current application. In some embodiments, the through vias 606 extend through the substrate 602 and couple at least one first bond pad 603 to at least one second bond pad 604.

In the illustrated embodiment, the stacked dies 608 are coupled to the substrate 602 by wire bonds 610, although other connections may be used, such as conductive bumps. In an embodiment, the stacked dies 608 are stacked memory dies. For example, the stacked dies 608 may include low-power (LP) double data rate (DDR) memory modules, such as LPDDR1, LPDDR2, LPDDR3, or the like memory modules.

In some embodiments, the stacked dies 608 and the wire bonds 610 may be encapsulated by a molding material 612. The molding material 612 may be molded on the stacked dies 608 and the wire bonds 610, for example, using compression molding. In some embodiments, the molding material 612 is a molding compound, a polymer, an epoxy, a silicon oxide filler material, the like, or a combination thereof. A curing step may be performed to cure the molding material 612, wherein the curing may be a thermal curing, a UV curing, the like, or a combination thereof. In some embodiments, the stacked dies 608 and the wire bonds 610 are buried in the molding material 612, and after the curing of the molding material 612, a planarization step, such as a grinding, is performed to remove excess portions of the molding material 612 and provide a substantially planar surface for the second packages 600.

After the second packages 600 are formed, the second packages 600 are bonded to the first packages 200 by way of conductive connectors 614, the second bond pads 604, and the first metallization pattern 110. In some embodiments, the stacked dies 608 may be coupled to the integrated circuit die 118 through the wire bonds 610, the first bond pads 603 and the second bond pads 604, the through vias 606, the conductive connectors 614, and the through vias 116.

The conductive connectors 614 may be similar to the conductive connectors 154 described above and the description is not repeated herein, although the conductive connectors 614 and 154 need not be the same. In some embodiments, before bonding the conductive connectors 614, the conductive connectors 614 are coated with a flux (not separately illustrated), such as a no-clean flux. The conductive connectors 614 may be dipped in the flux or the flux may be jetted onto the conductive connectors 614. In another embodiment, the flux may be applied to the surfaces of the first metallization patterns 110.

In some embodiments, the conductive connectors 614 may have an epoxy flux (not separately illustrated) formed thereon before they are reflowed with at least some of the epoxy portion of the epoxy flux remaining after the second package 600 is attached to the first package 200. This remaining epoxy portion may act as an underfill to reduce stress and protect the joints resulting from the reflowing the conductive connectors 614. In some embodiments, an underfill 616 may be formed between the second package 600 and the first package 200 and surrounding the conductive connectors 614. The underfill 616 may be formed by a capillary flow process after the second package 600 is attached or may be formed by a suitable deposition method before the second package 600 is attached.

The bonding between the second package 600 and the first package 200 may be a solder bonding or a direct metal-to-metal (such as a copper-to-copper or tin-to-tin) bonding. In an embodiment, the second package 600 is bonded to the first package 200 by a reflow process. During this reflow process, the conductive connectors 614 are in contact with the second bond pads 604 and the first metallization patterns 110 to physically and electrically couple the second package 600 to the first package 200. After the bonding process, an IMC (not separately illustrated) may form at the interface of the first metallization patterns 110 and the conductive connectors 614 and also at the interface between the conductive connectors 614 and the second bond pads 604 (not separately illustrated).

The semiconductor package 800 includes the first package 200 and the second package 600 mounted to a package substrate 700. The package substrate 700 may be referred to a package substrate 700. The second package 600 is mounted to the package substrate 700 using the conductive connectors 154.

The package substrate 700 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 700 may be a SOI substrate. Generally, an SOI substrate includes a layer of a semiconductor material such as epitaxial silicon, germanium, silicon germanium, SOI, SGOI, or combinations thereof. The package substrate 700 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films may be used for package substrate 700.

The package substrate 700 may include active and passive devices (not separately illustrated). As one of ordinary skill in the art will recognize, a wide variety of devices such as transistors, capacitors, resistors, combinations of these, and the like may be used to generate the structural and functional requirements of the design for the semiconductor package 800. The devices may be formed using any suitable methods.

The package substrate 700 may also include metallization layers and vias (not separately illustrated) and bond pads 702 over the metallization layers and vias. The metallization layers may be formed over the active and passive devices and are designed to connect the various devices to form functional circuitry. The metallization layers may be formed of alternating layers of dielectric (e.g., layers of low-k dielectric material) and conductive material (e.g., copper) with vias interconnecting the layers of conductive material and may be formed through any suitable process (such as deposition, damascene, dual damascene, or the like). In some embodiments, the package substrate 700 is substantially free of active and passive devices.

In some embodiments, the conductive connectors 154 can be reflowed to attach the first package 200 to the bond pads 702. The conductive connectors 154 electrically and/or physically couple the package substrate 700, including metallization layers in the package substrate 700, to the first package 200.

The conductive connectors 154 may have an epoxy flux (not separately illustrated) formed thereon before they are reflowed with at least some of the epoxy portion of the epoxy flux remaining after the first package 200 is attached to the package substrate 700. This remaining epoxy portion may act as an underfill to reduce stress and protect the joints resulting from the reflowing the conductive connectors 154. In some embodiments, an underfill (not separately illustrated) may be formed between the first package 200 and the package substrate 700 and surrounding the conductive connectors 154. The underfill may be formed by a capillary flow process after the first package 200 is attached or may be formed by a suitable deposition method before the first package 200 is attached.

Using the optical systems described above, including the tunable concave mirror 310, the beam splitter 406, combinations thereof, or the on-axis lens 506 improves the focus of the optical system and the quality of projected images. This improves the exposure of target layers 318 on the carrier substrate 102, which allows for finer structures to be patterned and formed. The improved projection quality also improves device performance and decreases device defects.

In accordance with an embodiment, an apparatus includes an optical path; a prism disposed on the optical path; a lens disposed on the optical path; and a tunable mirror disposed on the optical path, the tunable mirror including a mirror having a concave surface at a front-side thereof; a rear support attached to a backside of the mirror; and a plurality of fine-adjustment screws extending from the rear support to the backside of the mirror. In an embodiment, the prism includes a beam splitter. In an embodiment, the optical path passes through a central portion of the lens. In an embodiment, the optical path extends from an energy source to a support plate for holding a wafer, and a distance along the optical path from the energy source to the beam splitter is less than a distance along the optical path from the energy source to the tunable mirror. In an embodiment, the mirror has a circular shape and the rear support has a rectangular shape. In an embodiment, the optical path passes through a first portion of the lens and a second portion of the lens different from the first portion of the lens. In an embodiment, the apparatus further includes a second prism disposed on the optical path and a support plate for holding a wafer, the optical path extending from the prism towards the lens, the optical path extending from the lens towards the second prism, and the optical path extending from the second prism towards the support plate.

In accordance with another embodiment, a method includes generating energy using an energy source; directing the energy along an optical path to expose a surface of a target layer to the energy, directing the energy along the optical path including reflecting the energy using a tunable concave mirror; using a detector to detect a focus of the energy incident on the surface of the target layer; and adjusting fine-tuning screws on the tunable concave mirror based on the detected focus of the energy incident on the surface of the target layer to correct the focus of the energy incident on the surface of the target layer. In an embodiment, the method further includes moving the target layer while the surface of the target layer is exposed to the energy. In an embodiment, directing the energy along the optical path further including patterning the energy by directing the energy through a photomask, the method further including moving the target layer and the photomask while the surface of the target layer is exposed to the energy. In an embodiment, using the detector to detect the focus of the energy incident on the surface of the target layer includes calculating a distance between the detector and the surface of the target layer. In an embodiment, using the detector to detect the focus of the energy incident on the surface of the target layer includes analyzing a surface image of the surface of the target layer. In an embodiment, adjusting the fine-tuning screws includes using the detector to control a motor to adjust the fine-tuning screws on the tunable concave mirror. In an embodiment, directing the energy along the optical path further includes directing the energy through a beam splitter before reflecting the energy using the tunable concave mirror and directing the energy through the beam splitter after reflecting the energy using the tunable concave mirror. In an embodiment, directing the energy along the optical path further includes directing the energy through a first prism before reflecting the energy using the tunable concave mirror and directing the energy through a second prism after reflecting the energy using the tunable concave mirror.

In accordance with yet another embodiment, an optical system includes a tunable mirror including a mirror; a rear support disposed on a backside of the mirror; and a plurality of fine-adjustment screws extending through the rear support, at least one of the fine-adjustment screws contacting the backside of the mirror; a focus detector; and a motor connected to the focus detector and connected to the fine-adjustment screws. In an embodiment, the rear support is attached to the backside of the mirror by a central support disposed in a center of the backside of the mirror, and the fine-adjustment screws are disposed at edges of the mirror. In an embodiment, the optical system further includes an optical path extending from an energy source to a support platform for holding a wafer, the tunable mirror being disposed on the optical path between the energy source and the support platform, the support platform including a motor for moving the support platform. In an embodiment, the optical system further includes a reticle disposed on the optical path between the energy source and the tunable mirror, the reticle including a motor for moving the reticle. In an embodiment, the optical system further includes an optical path extending from an energy source to a support platform for holding a wafer; and a beam splitter disposed on the optical path, the optical path passing through the beam splitter twice.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
   an optical path extending from an energy source in a first direction;
   a prism disposed on the optical path;
   a lens disposed on the optical path;
   a second prism disposed on the optical path, wherein the optical path extends from the prism towards the lens, wherein the optical path extends from the lens towards the second prism;
   a tunable mirror disposed on the optical path, the optical path extending to and away from a major surface of the tunable mirror in a second direction perpendicular to the first direction, the tunable mirror comprising:
      a mirror having a concave surface at a front-side thereof;
      a rear support attached to a backside of the mirror; and
      a plurality of fine-adjustment screws extending from the rear support to the backside of the mirror; and
   a support plate configured to support a wafer, the optical path extending to a major surface of the support plate in the second direction, wherein the optical path extends from the second prism towards the support plate.

2. The apparatus of claim 1, wherein the prism comprises a beam splitter.

3. The apparatus of claim 2, wherein the optical path passes through a central portion of the lens.

4. The apparatus of claim 2, wherein the optical path extends from an energy source to a support plate for holding a wafer, and wherein a distance along the optical path from the energy source to the beam splitter is less than a distance along the optical path from the energy source to the tunable mirror.

5. The apparatus of claim 1, wherein the mirror has a circular shape and the rear support has a rectangular shape.

6. The apparatus of claim 1, wherein the optical path passes through a first portion of the lens and a second portion of the lens different from the first portion of the lens.

7. A method comprising:
   generating energy using an energy source;

directing the energy along an optical path to expose a surface of a target layer to the energy, wherein directing the energy along the optical path comprises reflecting the energy using a tunable concave mirror;

placing a shutter over the surface of the target layer;

using a detector to detect a focus of the energy incident on the surface of the target layer;

indicating the focus of the energy incident on the surface of the target layer detected by the detector on a focus indicator; and manually adjusting fine-tuning screws on the tunable concave mirror based on the indicated focus of the energy incident on the surface of the target layer to correct the focus of the energy incident on the surface of the target layer.

8. The method of claim 7, further comprising moving the target layer while the surface of the target layer is exposed to the energy.

9. The method of claim 7, wherein directing the energy along the optical path further comprises patterning the energy by directing the energy through a photomask, wherein the method further comprises moving the target layer and the photomask while the surface of the target layer is exposed to the energy.

10. The method of claim 7, wherein using the detector to detect the focus of the energy incident on the surface of the target layer comprises calculating a distance between the detector and the surface of the target layer.

11. The method of claim 7, wherein using the detector to detect the focus of the energy incident on the surface of the target layer comprises analyzing a surface image of the surface of the target layer.

12. The method of claim 7, wherein adjusting the fine-tuning screws comprises using the detector to control a motor to adjust the fine-tuning screws on the tunable concave mirror.

13. The method of claim 7, wherein directing the energy along the optical path further comprises directing the energy through a beam splitter before reflecting the energy using the tunable concave mirror and directing the energy through the beam splitter after reflecting the energy using the tunable concave mirror.

14. The method of claim 7, wherein directing the energy along the optical path further comprises directing the energy through a first prism before reflecting the energy using the tunable concave mirror and directing the energy through a second prism after reflecting the energy using the tunable concave mirror.

15. An optical system comprising:

a tunable mirror comprising:
 a mirror;
 a rear support disposed on a backside of the mirror; and
 a plurality of fine-adjustment screws extending through the rear support, at least one of the fine-adjustment screws contacting the backside of the mirror;

a plurality of lenses, wherein the plurality of lenses comprises one or more aspherical lenses and one or more spherical lenses, wherein a ratio of a number of spherical lenses in the plurality of lenses to a number of aspherical lenses in the plurality of lenses is from 0 to 3, and wherein the optical system comprises less than 10 lenses;

a focus detector;

a focus indicator configured to indicate a focus of energy incident on a surface of a target layer; and a shutter configured to be placed over the surface of the target layer.

16. The optical system of claim 15, wherein the rear support is attached to the backside of the mirror by a central support disposed in a center of the backside of the mirror, and wherein the fine-adjustment screws are disposed at edges of the mirror.

17. The optical system of claim 15, further comprising an optical path extending from an energy source to a support platform for holding a wafer, the tunable mirror being disposed on the optical path between the energy source and the support platform, the support platform comprising a motor for moving the support platform.

18. The optical system of claim 17, further comprising a reticle disposed on the optical path between the energy source and the tunable mirror, the reticle comprising a motor for moving the reticle.

19. The optical system of claim 15, further comprising:

an optical path extending from an energy source to a support platform for holding a wafer; and a beam splitter disposed on the optical path, wherein the optical path passes through the beam splitter twice.

20. The apparatus of claim 1, wherein the optical path passes through a first half of the lens between the prism and the tunable mirror, and wherein the optical path passes through a second half of the lens between the tunable mirror and the second prism.

* * * * *